United States Patent
Maeda et al.

[11] Patent Number: 5,953,630
[45] Date of Patent: Sep. 14, 1999

[54] SUPPRESSION OF TUNGSTEN FILM DEPOSITION ON A SEMICONDUCTOR WAFER BEVEL EDGE WITH A HALOGENIDE PURGE GAS

[75] Inventors: Yuji Maeda; Katsumi Mitani; Manabu Yamazaki; Naomi Yoshida; Keiichi Tanaka, all of Chiba, Japan

[73] Assignee: Applied Materials, Inc., Santa Clara, Calif.

[21] Appl. No.: 08/892,865

[22] Filed: Jul. 14, 1997

[51] Int. Cl.[6] ................................................. H01L 21/285
[52] U.S. Cl. ............................................ 438/680; 118/728
[58] Field of Search .................................. 438/569, 680, 438/935; 118/728

[56] References Cited

U.S. PATENT DOCUMENTS

| | | | |
|---|---|---|---|
| 5,556,476 | 9/1996 | Lei et al. | 118/728 |
| 5,728,629 | 3/1998 | Mizuno | 438/680 |
| 5,856,240 | 11/1994 | Sinha et al. | 438/680 |

Primary Examiner—Charles Bowers
Assistant Examiner—David S Blum
Attorney, Agent, or Firm—Robert W. Mulcahy

[57] ABSTRACT

Provided herein is a CVD method and apparatus for the deposition of tungsten in which formation of a film of tungsten material is suppressed at the peripheral edge of the semiconductor substrate. In accordance with the invention, a halogenide purge gas is supplied to the peripheral edge of the processing face of a semiconductor wafer during the chemical vapor deposition of tungsten. The halogenide purge gases interact with the processing gases and form a passivation film at the peripheral edge of the semiconductor wafer which suppresses or prevents the formation of a film of tungsten material on the edge surface. Consequently, CMP can be applied to the tungsten semiconductor wafer, and particles of the tungsten material, etc., are not generated from the intense polishing of the peripheral edge of the wafer. Therefore, an uncontaminated tungsten-coated semiconductor wafer with a precise multilayer electrode wiring structure can be manufactured in large volume and favorable yields.

14 Claims, 6 Drawing Sheets

5,953,630

SUPPRESSION OF TUNGSTEN FILM DEPOSITION ON A SEMICONDUCTOR WAFER BEVEL EDGE WITH A HALOGENIDE PURGE GAS

BACKGROUND OF THE INVENTION

1. Field of the Invention

The present invention relates to the deposition of tungsten-containing material on substrates used in semiconductor manufacture. More particularly, the invention relates to controlling the deposition of tungsten at the edges of circumferential semiconductor substrates.

2. Description of the Prior Art

Chemical vapor deposition, commonly referred to as "CVD," is one of a number of processes used to deposit thin layers of materials on a semiconductor wafer. To process wafers with the CVD process, a vacuum chamber is provided with a susceptor configured to receive a wafer thereon. In a typical prior art CVD chamber, the wafer is placed into and removed from the chamber by a robot blade and is supported by the susceptor during processing. In these typical systems, the susceptor and the wafer are heated to a temperature of between 200–650° C. prior to processing. Once the wafer is heated to an appropriate temperature, a processing fluid, typically a gas, is charged to the vacuum chamber through a gas manifold often situated above the wafer. The processing gas reacts with the heated wafer surface to deposit a thin material layer thereon. As the gas thermally reacts to form the material layer, volatile byproduct gases are formed, and these gases are pumped out of the vacuum chamber through a chamber exhaust system.

A primary goal of wafer processing is to obtain as many useful die as possible from each wafer. Many factors influence the processing of wafers in the CVD chamber and affect the ultimate yield of die from each wafer processed therein. These factors include processing variables which affect the uniformity and thickness of the material layer deposited on the wafer, and particulate contaminants that can attach to a wafer and contaminate one or more die therein. Both of these factors must be controlled in CVD and other processes to maximize the die yield from each wafer.

One of the causes of particulate contaminants both in the chamber and on a finished wafer is improper deposition at the edge of the substrates. Because edge deposition conditions are difficult to control, due in part to the fact that substrates edges are typically chamferred and deposition gas flow is non-uniform around these edges, non-uniform deposition can occur around a substrate's edge. This may lead to deposited layers not adhering properly to each other and/or not adhering properly to the substrate.

This problem is illustrated in FIG. 1 which is a schematic partial cross-section of a semiconductor substrate. The substrate 1 is shown with three consecutive layers, 2,3 and 4, deposited thereon. In the deposition of tungsten on the substrate (using $WF_6$ gas) the first layer 2 could typically be titanium, the second layer 3 would be titanium nitride, and the third (upper) layer 4 would be tungsten. Such a three-layer process for the deposition of tungsten is common as tungsten does not readily adhere to the silicon (or oxidized silicon) surface of the substrate. Accordingly, a very thin "primer" layer 2 of titanium is deposited, followed by a second layer 3 of titanium nitride. Tungsten readily adheres to titanium nitride (TiN). As can be seen from FIG. 1, however, the tungsten layer 4 has "wrapped" around onto the beveled outer edge 5 of the substrate to contact directly with the silicon substrate. The problem with this wrap-around adhesion is that tungsten does not adhere to the silicon substrate surface and could readily chip and flake during the handling of the substrate, resulting in particulate contaminants.

Multiple-layered semiconductor configurations are presently very prominent in the manufacture of large-scale integrated circuits. In these multilayered semiconductor devices, the formation of the electrical wiring connecting the layers is critical to the complex semiconductor devices. Additionally, in the formation of multiple-layered semiconductor substrates, planarization technology has also become critical to making optimum flat surfaces to accommodate a multilayerd electrode wiring structure.

In the application of tungsten material to form the electrode wiring resulting in low resistance interconnects in VLSI circuits, CVD methods are known. For example, as demonstrated in FIG. 10, a tungsten nucleation film of oxide 204, which serves as the nucleus for forming a film of tungsten material, is formed on a semiconductor substrate generally comprised of multiple layers having metal wire interconnects 200 distributed therein. Subsequently, a blanket film of tungsten material 206 is applied forming further metal wiring interconnects, and planarization or flattening is accomplished by means of an etchback process which etch-flattens the entire surface of said tungsten film. Note here that the bevelled edge deposition of tungsten adheres to the oxide layer 204 in the same fragile manner as demonstrated in FIG. 1.

In recent planarization technology for semiconductor wafers, a contact-type polishing method called CMP (chemical mechanical polishing) has become prominent. The CMP method achieves flattening or planarization by mechanically polishing the irregular surface generally accompanying a fabricated multilayered semiconductor wafer structure. In this CMP process, a chemical polishing agent and pad are employed to homogeneously polish the wafer. Because of the contact polishing of the wafer in the CMP process, the polished wafer surface becomes more uniformly flatter compared to the etchback method, so a precise multilayered electrode wiring structure can be achieved. However, as pointed out above with reference to FIG. 1, the outer peripheral edge of a tungsten-coated semiconductor wafer is generally chamferred, thereby causing the tungsten layer to deposit directly on the silicon substrate with which tungsten does not readily adhere. This unstable edge-deposited tungsten is readily removed during chemical-mechanical polishing thereby contaminating both the polishing process and the wafer itself with unwanted particles of tungsten strewn over the polishing pad and wafer surface.

SUMMARY OF THE INVENTION

The present invention is directed to a chemical vapor deposition device and method for forming a film of tungsten material characterized by supplying a halogen-containing (halogenide) purge gas for suppressing film formation to the peripheral edge of a semiconductor substrate during CVD processing. The application of the instant halogenide purge gases to the circumferential edge portion of a semiconductor wafer causes the formation of a passivation layer at the beveled edge of the semiconductor wafer which inhibits the formation of tungsten on the peripheral edge or bevel of the wafer. In this way, formation of pure tungsten film at the wafer edges is restrained or suppressed during CVD processing while the blanket deposition of tungsten proceeds on the inner area of the wafer. There results a semiconductor wafer surface which can withstand CMP as a polishing process because no residue of tungsten is generated at the peripheral edge during polishing due to the suppressed deposition of tungsten film on the wafer bevel well below the planarization line.

The purge gases of the present invention are any halogenides which interact with the CVD processing gases to form a tungsten passivating layer at the peripheral edge of a circumferential semiconductor substrate. Preferred halogenide gases are halides selected from a group consisting essentially of chlorine ($Cl_2$), chloro-trifluoromethane ($ClF_3$), fluorine ($F_2$), boron trichloride ($BCl_3$), nitrogen trifluoride ($NF_3$), and hexafluoroethane ($C_2F_6$). Other purge gases such as argon and/or hydrogen may be used in combination with the halogenide purge gases of the present invention.

The present invention is additionally directed to a semiconductor substrate support characterized by a gas supply means provided for supplying a halogenide gas to the peripheral edge of a supported semiconductor wafer to suppress film formation thereon. The purge gas supply means has a manifold extending radially outward from the bottom central region of the susceptor, and an annular gas channel connected to the manifold at the peripheral region of the susceptor and extending vertically to the semiconductor support face of the susceptor. Therefore, the susceptor can supply the passivating purge gas of the present invention to the peripheral edge of a semiductor substrate so as to suppress the film formation on the edge region of the substrate.

The film-forming device of the present invention comprises a chamber; a susceptor substrate support disposed in the chamber for receiving a semiconductor substrate for processing thereon, said susceptor having a gas supply means which supplies a gas for suppressing film formation to the peripheral edge of said semiconductor substrate; a gas supply source which is connected to said gas supply means; and a reaction gas supply source which supplies a reaction gas for the chemical vapor deposition for formation of a film of tungsten material on said semiconductor wafer. When a film of tungsten material is formed using this device, a purge passivating gas of the present invention is supplied to the peripheral edge of a semiconductor substrate thereby suppressing film formation at the edge region of the processed substrate.

The instant invention is also directed to a process of forming a tungsten-containing film on a substrate having a circumferential edge and a face for processing, comprising placing a substrate on a support comprised of an annular gas channel to circumscribe the circumferential edge of a substrate; flowing a tungsten-containing gas to the processing face of the substrate; and passing a halogenide gas through the annular gas channel of the support to interact with the tungsten-containing processing gas and to suppress the deposition of tungsten on the circumferential edge of the substrate.

DETAILED DESCRIPTION OF THE INVENTION

Figure 2:
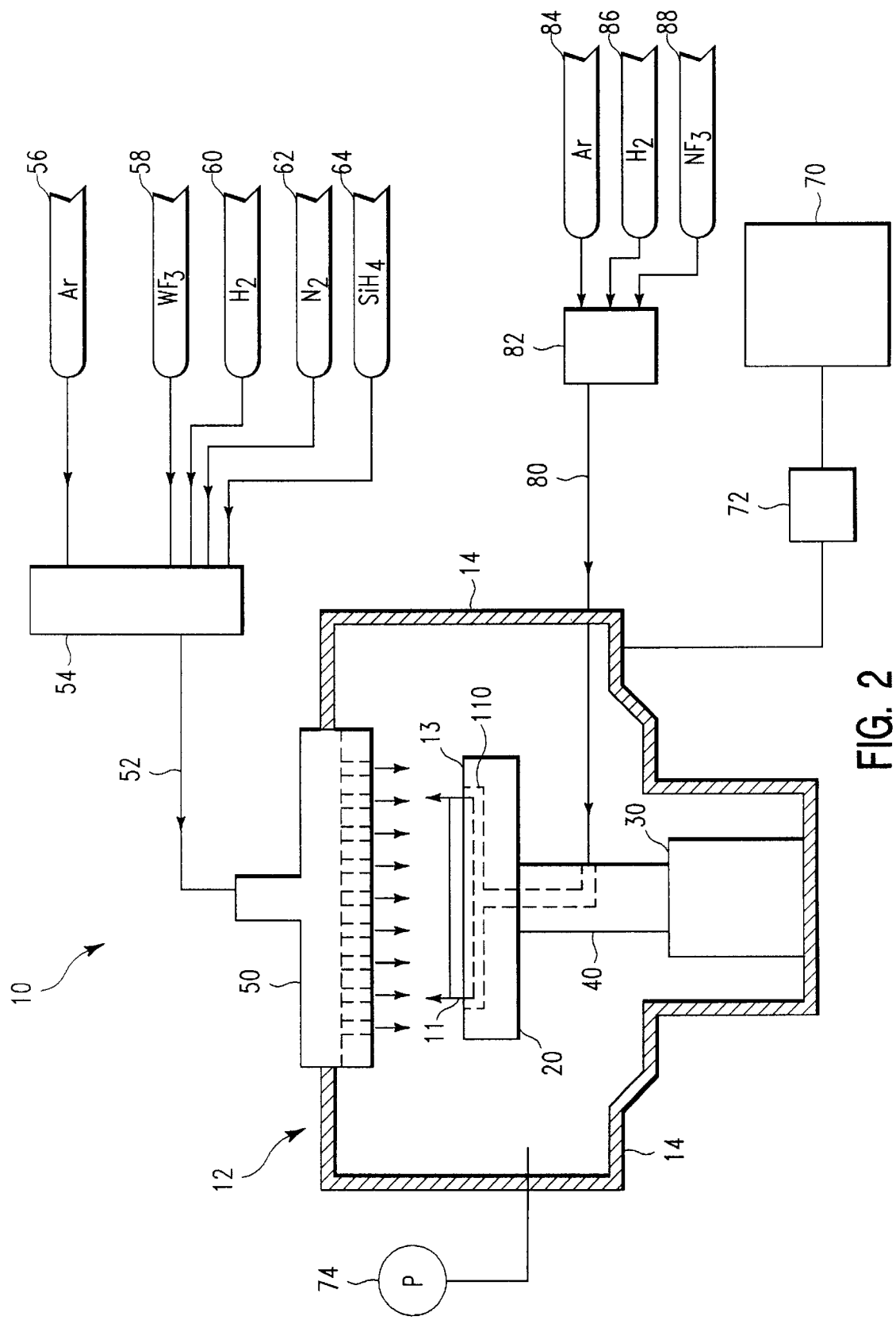
FIG. 2 is a sectional view of a processing apparatus of the present invention.

Referring in general to FIG. 2, the CVD processing reactor 10 of the present invention includes multiple features and embodiments, which may be used independently or concurrently, to provide improvements in the structure and operation of substrate processing chambers. In this figure, the cooperation and interaction of several features are shown, including an internally heated substrate support pedestal, or susceptor 20, including a heater (not shown in the figure) within chamber 12, which susceptor 20 supports the semiconductor substrate wafer 11. Gas distributor 50 which passes through the top of chamber wall 14 is provided above susceptor 20 for application of reaction gases. Also, reaction gas conduit 52 extends from the top of the distributor 50 via a multiple-component flow regulator 54 which regulates the flow rate of each gas component, and is connected to the reaction gas supply source comprised of Ar gas source 56, $W_6$ gas source 58, $H_2$ gas source 60, $N_2$ gas source 62, and $SH_4$ gas source 64. According to this configuration, a reaction gas supply assembly is provided and allows a film of tungsten material to be formed on semiconductor wafer 11, in accordance with a CVD process, by supplying a reaction gas into chamber 12, as indicated by the arrows emanating from the orifices in the distributor 50 in FIG. 2.

In this chamber configuration of FIG. 2, vacuum pump 70 is connected to chamber 12 via regulator adjuster 72 in chamber 12 in order to deposit the film of tungsten material under the necessary pressure. Furthermore, vacuum gauge 74 is attached to chamber 12, and the pressure within chamber 12 is monitored during processing. Drive mechanism 30, for moving susceptor 20 vertically, is attached at the bottom of susceptor 20 via drive shaft 40 so that the distance between gas distributor 50 and susceptor 20 can be varied according to any desired CVD process. Put another way, the heater pedestal or susceptor 20 is actuable upwardly within chamber 12 to hold a substrate 11 on the susceptor surface 13 and downwardly in reactor 10 for removal therefrom. To position the wafer substrate 11 on the susceptor support surface 13, a number of means well known to those skilled in the art (e.g., a plurality of support pins) may be employed. As illustrated in detail in FIGS. 3 and 4, when the substrate is received centrally on the susceptor surface 13 or, alternatively, in a pocket 107 (formed by a height differential between outer gas channel wall 112 and inner gas channel wall 106), the circumferential substrate on wafer 11 is circumscribed by an annular gas channel 100 defined by the inner and outer gas channel walls 106 and 112, respectively.

A purge gas supply means 84, 86, and 88, is provided to susceptor 20 and allows purge gas to be supplied to the peripheral edge of semiconductor wafer 11, as indicated by the arrows emanating from the manifold 110 in FIG. 2. The purge gas supply means is connected to a purge gas supply source having a halide gas source via a multiple-component flow regulator 82 and purge gas conduit 80 which extend by passing through the inside of the drive shaft 40. In this illustration, the purge gas supply source is composed of a nitrogen trifluoride ($NF_3$) gas source 88 in addition to argon (Ar) gas source 84 and a hydrogen ($H_2$) gas source 86.

Figure 1:
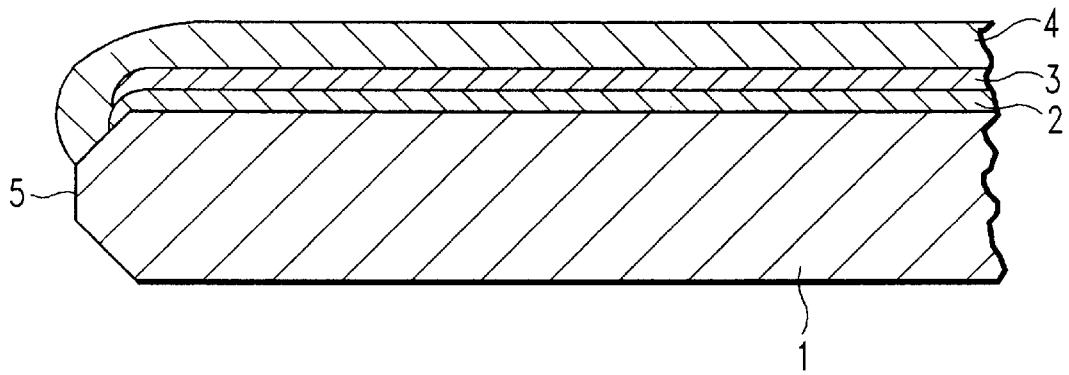
FIG. 1 is a partial cross-section of a semiconductor substrate illustrating the general deposition of material layers at the edge of the substrate.
Figure 3:
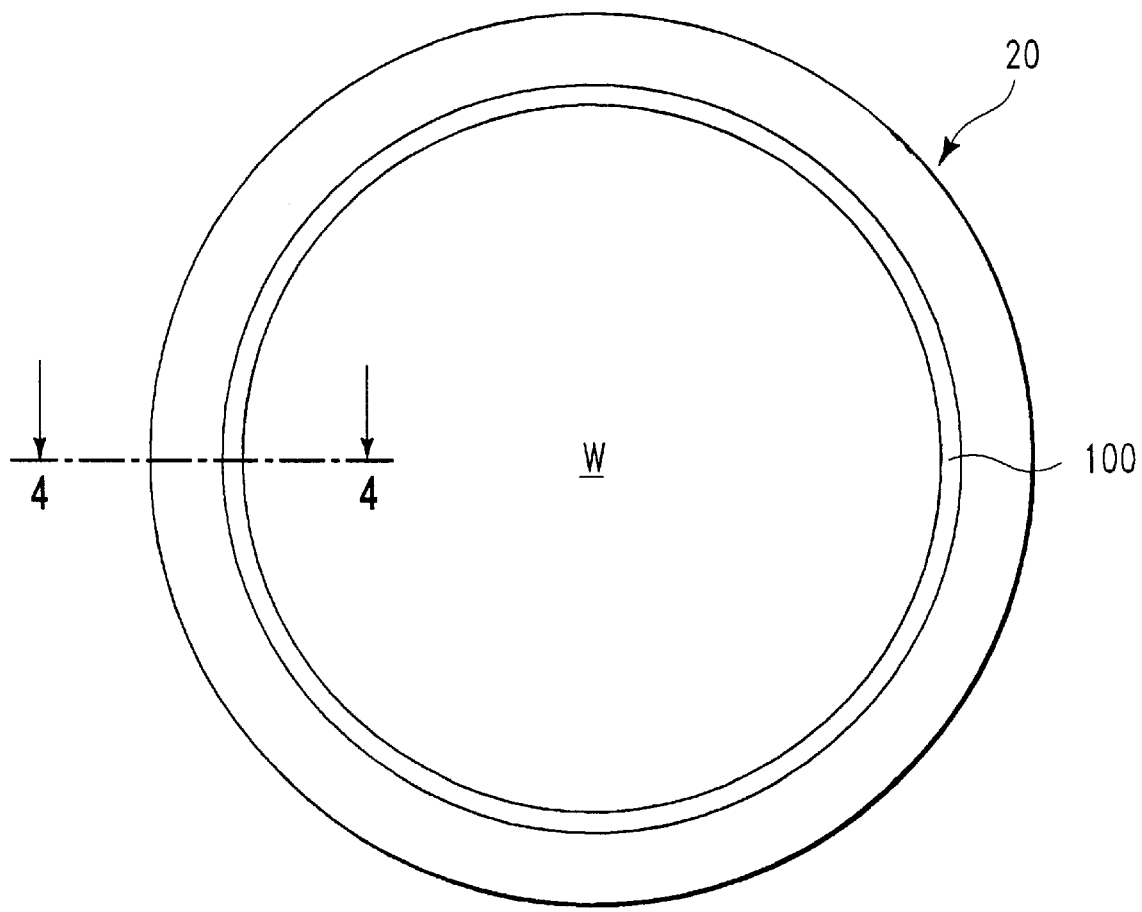
FIG. 3 is an elevated schematic view of the susceptor disposed in the chamber of FIG. 2.
Figure 4:
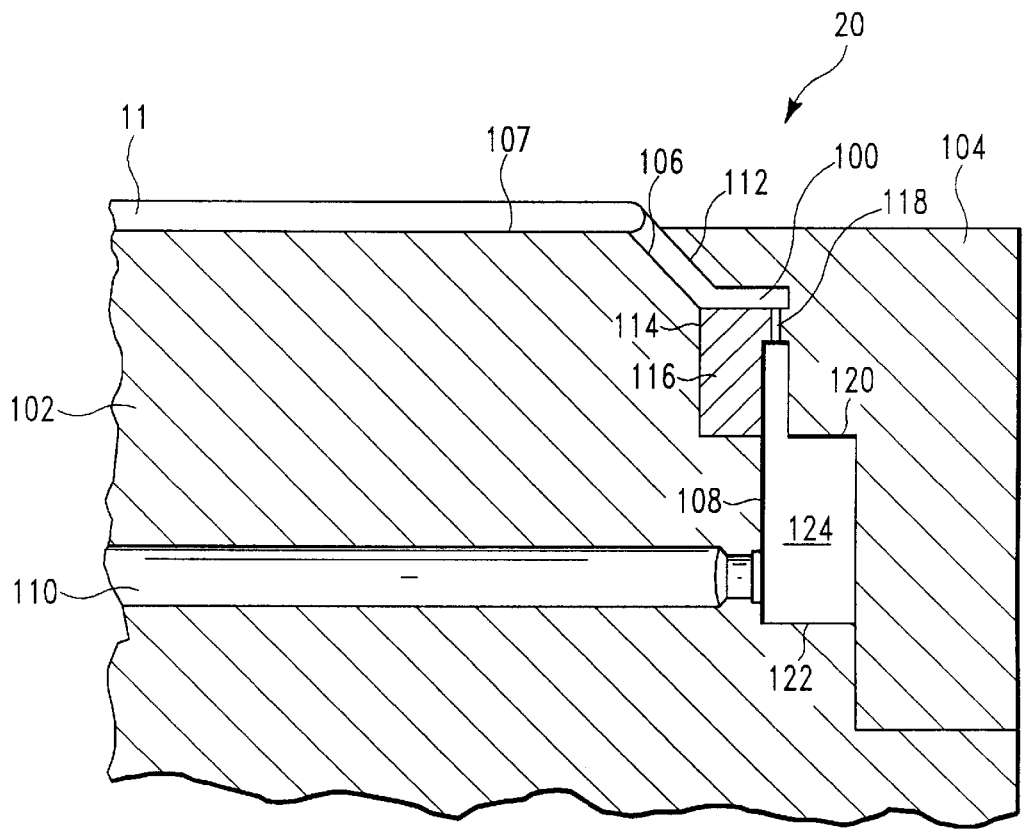
FIG. 4 is an enlarged partial sectional view along line A—A of the susceptor shown in FIG. 3.
Figure 10:
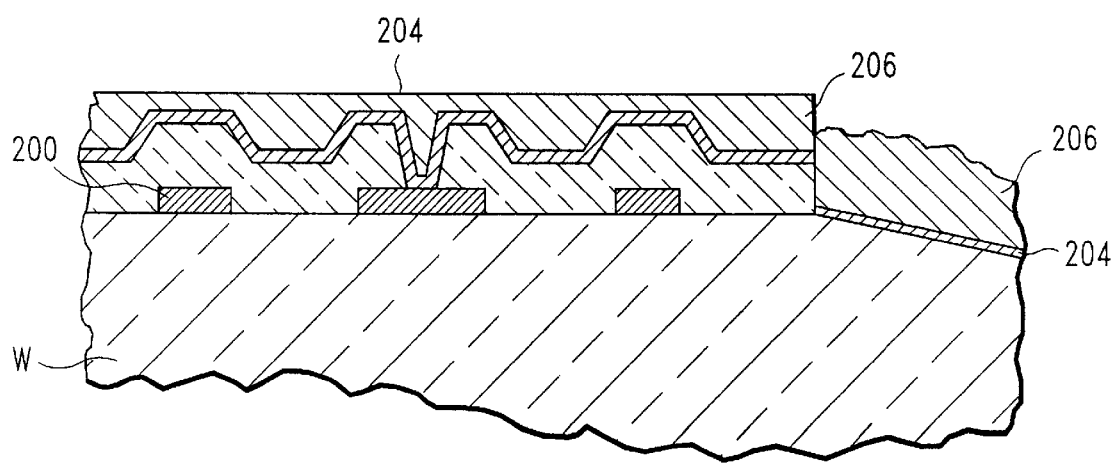
FIG. 10 is an enlarged cross-section view of a tungsten coated semiconductor wafer prepared under conventional CVD conditions.

Turning to the purge gas supply means in FIG. 3, annular purge gas channel 100 is provided on the top surface of susceptor 20 so as to surround semiconductor wafer 11 and allow purge gas to be supplied to the periphery of the wafer 11. Referring generally to FIGS. 3 and 4, susceptor 20 is formed from wafer support base 102, and annular member 104 provided at the periphery of wafer support base 102 of susceptor 20. Annular outer inclined surface 106, which is at a downward incline with respect to the wafer support surface 107, and annular outer stepped wall 112 both form a stepped channel 100 to the top outer wafer support surface 107 of wafer support base 102. Lower level vertical surface 108 at the lower end of stepped channel 100 is connected to manifold 110 which extends from the central bottom surface region of the wafer support and expands radially.

Annular outer inclined wall 112 forms a channel with inner inclined surface 106 and the stepped channel arrangement terminates at the source purge gas manifold 110 entry adjacent gas chamber 124 floor 122. Annular projection part 116, which has an L-shaped cross section and is cushioned against vertical surface 114 at the inner stepped portion of susceptor base 102, is positioned in such a manner to form aperture 118. By partially engaging member 104 and wafer support base 102 with the L-shaped section 116, purge gas channel 100 is formed between the inner and outer stepped surfaces in FIG. 4. When horizontally disposed lower level surfaces 120 and 122 of the inner and outer stepped portions of the channel 100 are arranged with suitable spacing and width defined by vertical wall 108 and that of annular piece 104, purge gas storage chamber 124 is formed between the two.

The following illustrates the instant CVD apparatus and process for forming a film of tungsten material making reference primarily to FIG. 5 and, secondarily, to FIGS. 2–4.

A semiconductor wafer 11 with metal wiring on interconnects 200 and oxide film 202 formed on the surface is loaded on susceptor 20 with purge gas channel 100 in an open position, thereby providing a purge gas composition of Ar, $H_2$ and $NF_3$ through channel 100 to the peripheral edge of wafer 11. Chamber 12 is then evacuated using vacuum pump 70. By heating and baking in chamber 12 using a heater (not shown in the figures), the gas molecules adsorbed to the inner surface of chamber wall 14 are removed and a natural oxide film formed on semiconductor wafer 11 is also removed. Chamber 12 is cooled naturally after baking. When the pressure within chamber 12 reaches a prescribed value, $NF_3$, Ar, and $H_2$ gases are then supplied at certain flow rates to the peripheral edge of the semiconductor wafer using purge gas supply means 84, 86 and 88. At this time, the flow path of the purge gas narrows at aperature 118 so the purge gas at a fixed pressure is stored in purge gas storage chamber 124. In this way, pressurized purge gas is evenly supplied at a fixed flow rate to the peripheral edge of semiconductor wafer 11 via the channel 100.

Figure 5A:
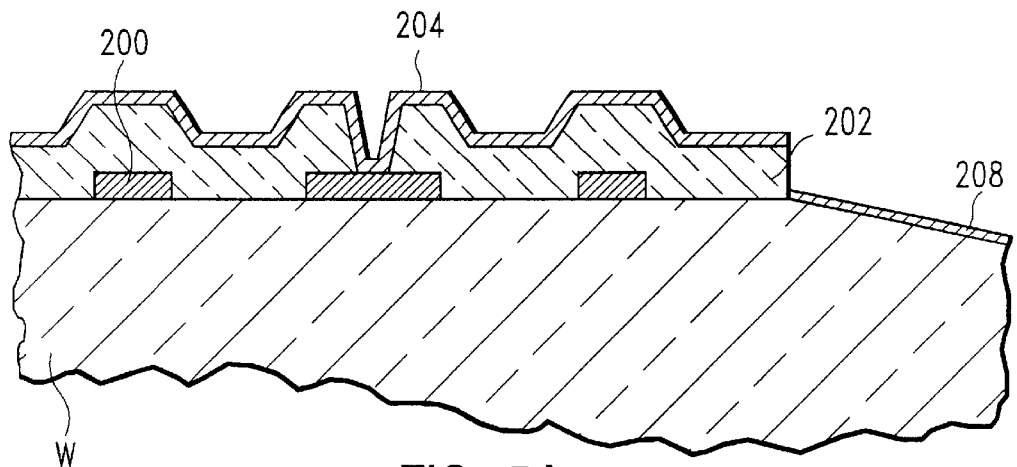
FIGS. 5 (a), (b) and (c) are partial cross-sections of a semiconductor substrate illustrating a tungsten deposition process according to the present invention.

Semiconductor wafer 11 is then heated to a prescribed temperature using the heater of susceptor 20. When semiconductor wafer 11 reaches the prescribed temperature, a reaction gas composed of $W_6$ and $SiH_4$ gases is introduced to the chamber from the reaction gas supply sources 58 and 64; and tungsten material nucleation film 204 is deposited on semiconductor wafer 11 in a prescribed amount to act as a nucleus for subsequent tungsten deposition, as shown in FIG. 5(a).

Figure 5B:
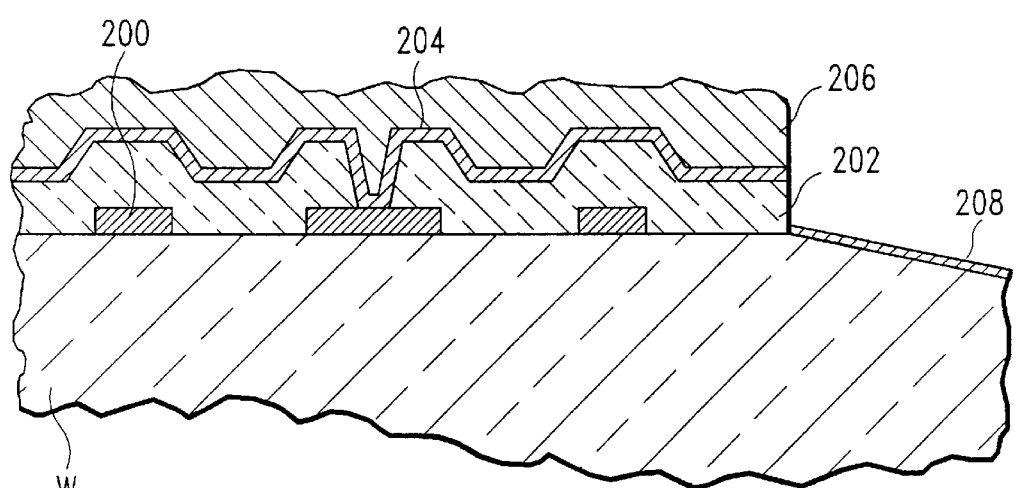

Next, a reaction gas mixture of $WF_6$ and $H_2$ is introduced at a prescribed flow rate to the chamber from reaction gas supply sources 58 and 60, and tungsten material 206 is formed as a film on said nucleation film 204 by a CVD process as shown in FIG. 5(b). Concurrently, the reaction gases $WF_6$ and $H_2$ interact and react with the purge gas flow composition from channel 100. Consequently, passivation film 208 is formed at the peripheral edge by the reaction of the halide-containing purge gas and the reaction gases, the purge gas having been supplied to the peripheral edge of semiconductor wafer 11 as described above. With the formation of passivation film layer 204 and the continued infusion of purge gas during tungsten deposition, tungsten film formation at the peripheral edge of wafer 11 is suppressed or prevented.

While not to be construed to limit the purview of the present invention, the mechanism by which the deposition of tungsten on the bevel edge of wafer 11 is prevented or suppressed is not completely understood. It is theorized that the incoming halogenide purge passivating gas both (1) reacts with reaction gases to form an adsorbed or adherent thin passivation layer or film 208, and (2) physically and chemically interferes with the formation of tungsten about the area of halogenide purge gas flow through channel 100, the peripheral or bevel edge of the wafer.

Figure 5C:
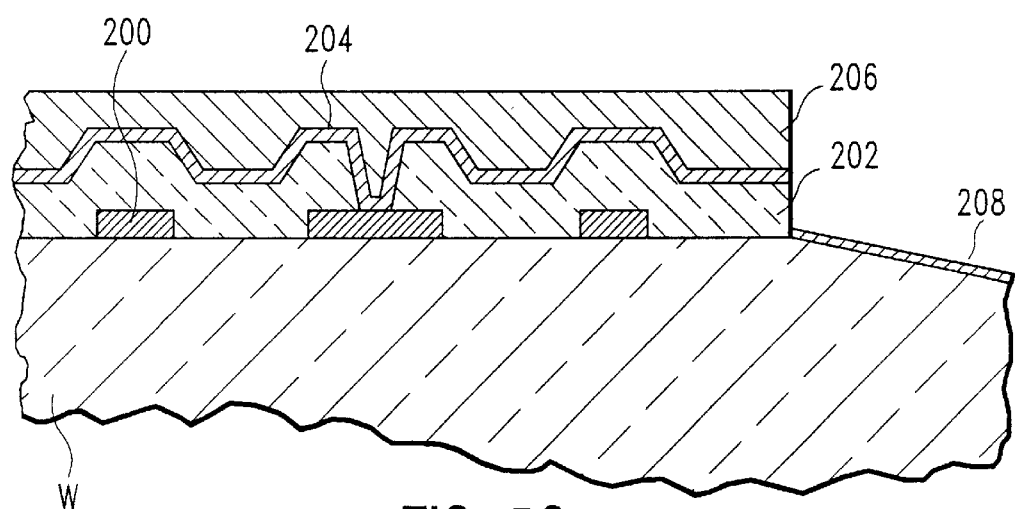

Thereafter, the semiconductor wafer is removed from the chamber using a transfer robot (not shown in the figures). Next, as shown in FIG. 5(c), flattening or planarizing of the semiconductor wafer 11 surface is accomplished using a conventional CMP device well known to persons skilled in the art. It is found that tungsten material residue is not generated during the abrasive polishing of the wafer 11, which polishing is particularly intense at the edges of a polished wafer. Therefore, it follows that particles of tungsten are not generated at the wafer bevel edges as a result of the residual flaking and peeling of tungsten as would be expected in the conventional tungsten CVD processing of semiconductor wafers not employing the instant halogenide gases. Additionally, the yield of a semiconductor device processed herein will not be diminished from those yields in conventional tungsten CVD processing.

Figure 6:
FIG. 6 is a drawing of a a scanning electron micrograph (SEM image) of a semiconductor wafer top peripheral edge when tungsten material is formed into a film in the condition shown in Table I.
Figure 8:
FIG. 8 is a drawing of a scanning electron micrograph (SEM image) of the peripheral edge of a semiconductor wafer processed employing a purge gas composed solely of Ar.
Figure 9:
FIG. 9 is yet another drawing of a scanning electron micrograph (SEM image) of the peripheral edge of a semiconductor wafer processed employing a purge gas composed solely of Ar.

The top peripheral edge of semiconductor wafer 11 formed with tungsten material in accordance with the present process, was observed using a scanning electron microscope (SEM). FIG. 6 shows a drawing of a SEM image of the top edge of semiconductor wafer 11 on which a film of tungsten material is formed under conditions outlined in Table I (below). Particulate material, such as tungsten, is not observed in the SEM drawing of FIG. 6 on the processed face of semiconductor wafer 11. On the other hand, tungsten material particles are observed (as shown in FIG. 8) when a purge gas composed solely of Ar and $H_2$ is supplied to semiconductor wafer 11 during film formation. Also, even when the flow rate of the purge gas of Ar and $H_2$ is increased, tungsten material particles are observed at the top peripheral edge of semiconductor wafer 11 in FIG. 9. Therefore, it is not possible to completely suppress the formation of a film of tungsten material at the peripheral edge with the sole use of this conventional type of purge gas.

TABLE I

| Chamber Pressure | Reaction Gas Flow Rate (sccm) | | | | Purge Gas Flow Rate (sccm) | | |
|---|---|---|---|---|---|---|---|
| (torr) | $W_6$ | $H_2$ | Ar | $N_2$ | Ar | $H_2$ | $NF_3$ |
| 80 | 95 | 700 | 1000 | 300 | 2000 | 425 | 1 |

Figure 7:
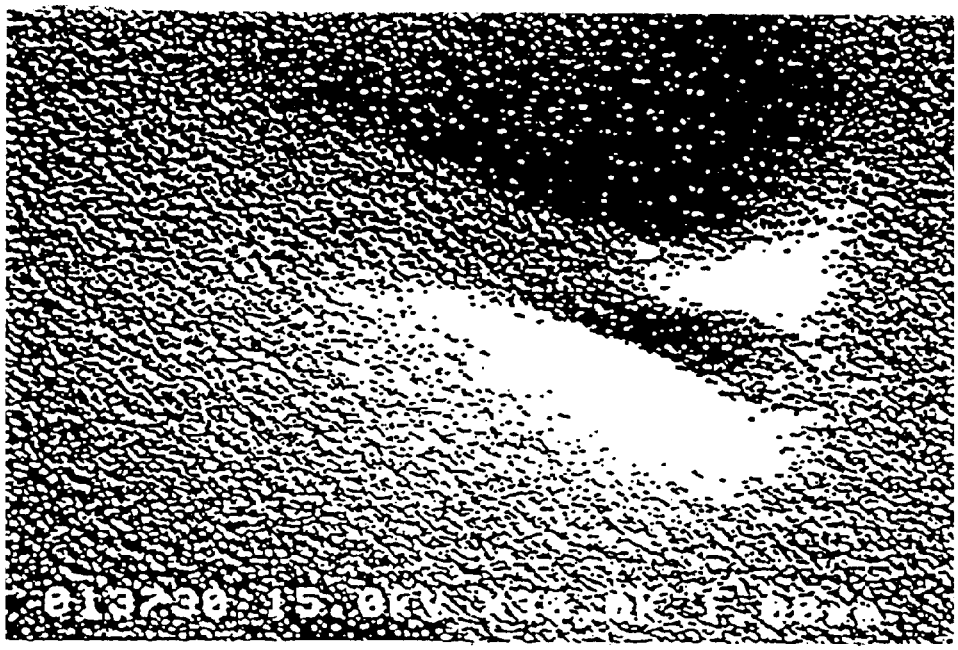
FIG. 7 is a drawing of a scanning electron micrograph (SEM image) of a semiconductor wafer top peripheral edge when tungsten material is formed into a film employing the conditions shown in Table II.

In another embodiment, when the semiconductor wafer is formed using $C_2F_6$ instead of $NF_3$ as the purge gas under conditions indicated in Table II (below) and conventional chemical mechanical polishing applied to planarize the semiconductor wafer, basically the same result as demonstrated in the examples given above was obtained and shown in the SEM drawing of FIG. 7; namely, although some roughness is created on the semiconductor wafer surface, tungsten material particles are not observed (contrast with FIGS. 8 and 9), thereby indicating the effectiveness of the edge effect of the instant halogen-containing passivating gases on the tungsten-coated semiconductor wafer.

TABLE II

| Chamber Pressure | Reaction Gas Flow Rate (scmm) | | | | Purge Gas Flow Rate (sccm) | | |
|---|---|---|---|---|---|---|---|
| (torr) | W | $H_2$ | Ar | $N_2$ | Ar | $H_2$ | $C_2F_6$ |
| 90 | 95 | 700 | 1900 | 300 | 1600 | 425 | 1 |

As noted in the above examples, it is possible to sufficiently suppress the formation of a film of tungsten material at the semiconductor wafer peripheral edge by using the fluorides $NF_3$ and $C_2F_6$. The other halogenide gases cited are equally as effective. Consequently, in the preparation of VLSI structures which require the precision polishing of CMP to attain the required planarization and geometries, the peripheral edges of the tungsten-coated wafers prepared in accordance with the present invention demonstrate integrity with no evidence of tungsten particulate residue. Therefore, a precise tungsten-coated multilayered electrode wiring or interconnect is realized with favorable yield employing the halogenide purge gases of the present invention in a tungsten CVD process.

While $NF_3$ and $C_2F_6$ were demonstrated as effective halide gases herein, similar results can be obtained with $Cl_2$, $F_2$, $ClF_3$, and $BCl_3$. In particular, chlorine $Cl_2$ is adsorbed at the peripheral edge of the semiconductor substrate and passivation occurs prior to the formation of a film or coating of tungsten material. During the subsequent formation of a tungsten coating, the tungsten material migrating to or depositing at the peripheral edge of the semiconductor substrate reacts with the $Cl_2$ purge gas and volatile $WCl_6$ is produced, which gas can cause etching of the peripheral surface of the wafer. Therefore, passivation by adsorption and etching by chemical reaction of the reaction and purge sets of gases may occur simultaneously during tungsten film formation depending on the type of purge gas employed. Also, the same functional effect is generated when the Ar contained in the purge gas is substituted with a generally chemically inert gas, such as $N_2$; that is, the inert gases Ar and $N_2$ are interchangeable in the halide passivation gas compositions of the present invention.

Additionally, the process conditions for forming a film of tungsten material are not limited to those used in the aforementioned examples and embodiments, and the effectiveness of the instant halogenide gases in suppressing edge deposition of tungsten on a semiconductor wafer occurs under all operable tungsten CVD conditions. For example, tungsten film deposition will be suppressed under conditions where the pressure of the chamber is 60–95 torr and the flow rate of the reaction gas, such as $W_6$, $H_2$, Ar, and $N_2$, is 60–95 sccm, 450–1500 sccm, 300–2800 sccm, and 0–300 sccm, respectively, or if the flow rate of a purge gas composed of Ar, $H_2$, and halides of the present invention are 1600–2800 sccm, 100–475 sccm, and 60–95 sccm, respectively.

In addition, the shape of the susceptor used for forming a film or coating of tungsten material is not limited to that shown in the embodiments and a purge gas conduit can be positioned above the semiconductor wafer surface so that the purge gas can be supplied sufficiently to the semiconductor wafer peripheral edge by an entirely different purge gas distribution system. Also, the purge gas channel can be arranged at equal intervals along the periphery of the semiconductor wafer instead of the present annular embodiment over the entire periphery of the semiconductor wafer.

According to the present invention, an apparatus and process for suppressing the chemical vapor deposition of tungsten on the peripheral edges of semiconductor wafers is provided. Consequently, tungsten-coated VLSI semiconductor wafers are provided which can withstand CMP planarization, a necessary process for presently critical semiconductor geometries. Therefore, the semiconductor wafer tungsten coatings of the present invention are not contaminated by the particles ordinarily originating on the peripheral edges of conventional CVD prepared semiconductor devices. Those tungsten-coated devices prepared by the process of the present invention have a precise multi-layer electrode wiring or interconnect structure with favorable yield.

What is claimed:

1. In a chemical vapor deposition process for forming a film of tungsten on a semiconductor substrate having a processing face and a peripheral edge, the improvement comprising the step of:

supplying a halogenide purge gas to the peripheral edge portion of the semiconductor substrate for restraining or suppressing the formation of tungsten film on this region of the substrate by forming a passivation layer.

2. The process of claim 1 wherein the halogenide is a halide gas selected from the group consisting essentially of chlorine ($Cl_2$), chloro-trifluoromethane ($ClF_3$), fluorine ($F_2$), boron trichloride ($BCl_3$), nitrogen trifluoride ($NF_3$), and hexafluoroethane ($C_2F_6$).

3. The process of claim 1 wherein the purge gas additionally comprises inorganic gases selected from the group consisting essentially of argon (Ar) and hydrogen ($H_2$).

4. A process for inhibiting, restraining, or suppressing the deposition of tungsten on a portion of a semiconductor substrate comprising:

i) providing an annular fluid channel to circumscribe the circumferential edge of a substrate to allow a gas flow in a direction substantially perpendicular to the tungsten-containing fluid flow engaging the processing face of the substrate; and ii) flowing a halogenide purge gas through the annular channel so as to restrain or suppress the deposition of tungsten on the circumferential edge of the substrate by forming a passivation layer.

5. The process of claim 4 wherein the halogenide is a halide gas selected from the group consisting essentially of chlorine ($Cl_2$), chloro-trifluoromethane ($ClF_3$), fluorine ($F_2$), boron trichloride ($BCl_3$), nitrogen trifluoride ($NF_3$), and hexafluoroethane ($C_2F_6$).

6. The process of claim 4 wherein the purge gas additionally comprises inorganic gases selected from the group consisting essentially of argon (Ar) and hydrogen ($H_2$).

7. The process of claim 4, further comprising the step of aligning the substrate with respect to the annular fluid channel so as to provide uniform flow of halogenide gas about the circumferential edge of the substrate.

8. A process of forming a tungsten-containing film on a substrate having a circumferential edge and a face for processing comprising:
   i) placing a substrate on a support comprised of an annular gas channel to circumscribe the circumferential edge of a substrate;
   ii) flowing a tungsten-containing processing gas to the processing face of the substrate; and
   iii) passing a halogenide gas through the annular gas channel of the support to interact with the tungsten-containing processing gas and to suppress the deposition of tungsten on the circumferential edge of the substrate by forming a passivation layer.

9. The process of claim 8 wherein the halogenide is a halide gas selected from the group consisting essentially of chlorine ($Cl_2$), chloro-trifluoromethane ($ClF_3$), fluorine ($F_2$), boron trichloride ($BCl_3$), nitrogen trifluoride ($NF_3$), and hexafluoroethane ($C_2F_6$).

10. The process of claim 8 wherein the purge gas additionally comprises inorganic gases selected from the group consisting essentially of argon (Ar) and hydrogen ($H_2$).

11. The process of claim 8, further comprising the step of aligning the substrate with respect to the annular fluid channel so as to provide uniform flow of halogenide gas about the circumferential edge of the substrate.

12. A process of processing a substrate having a circumferential edge and a first face for processing comprising:
    i) providing a substrate support for receiving the substrate in a processing chamber;
    ii) defining an annular purge gas channel in the support to surround the circumferential edge of a substrate to enable exposure of the substrate edge to a purge gas; and
    iii) passing a halogenide gas through the annular purge gas channel to prevent the processing gas from contacting the circumferential edge of the substrate by forming a passivation layer.

13. The process of claim 12 wherein the halogenide is a halide gas selected from the group consisting essentially of chlorine ($Cl_2$), chloro-trifluoromethane ($ClF_3$), fluorine ($F_2$), boron trichloride ($BCl_3$), nitrogen trifluoride ($NF_3$), and hexafluoroethane ($C_2F_6$).

14. The process of claim 12 wherein the purge gas additionally comprises inorganic gases selected from the group consisting essentially of argon (Ar), hydrogen ($H_2$), and nitrogen ($N_2$).

* * * * *